HIGH EFFICIENCY RADIO-FREQUENCY POWER AMPLIFIER

Filed Nov. 2, 1949 2 Sheets-Sheet 1

INVENTOR
W. H. DOHERTY
BY Charles Baraff
AGENT

Nov. 10, 1953 W. H. DOHERTY 2,658,959

HIGH EFFICIENCY RADIO-FREQUENCY POWER AMPLIFIER

Filed Nov. 2, 1949 2 Sheets-Sheet 2

INVENTOR
W. H. DOHERTY
BY Charles Baraff
AGENT

Patented Nov. 10, 1953

2,658,959

UNITED STATES PATENT OFFICE 2,658,959

HIGH EFFICIENCY RADIO-FREQUENCY POWER AMPLIFIER

William H. Doherty, Summit, N. J., assignor to Bell Telephone Laboratories, Incorporated, New York, N. Y., a corporation of New York Application November 2, 1949, Serial No. 125,025

5 Claims. (Cl. 179—171)

This invention relates primarily to vacuum tube power amplifiers for signal-modulated waves.

An object of the invention is to provide high efficiency linear power amplification of an amplitude modulated carrier wave.

A feature of the invention is the provision of under-neutralization and overneutralization respectively in linear power amplifiers located in parallel transmission paths, whereby the phases of input modulated waves may be varied with a resulting variation in the effective plate load impedances over a 4 to 1 range during the modulation cycle.

When power amplifiers are operated at constant plate potential (i. e., where the modulation has been effected in an earlier stage and the anodes of later stages are at constant potential), the plate efficiency at the unmodulated carrier level usually does not exceed about 33 per cent, if the amplifier is to maintain a high degree of linear amplification of the fully modulated carrier. The reasons for this limitation are understood in the art and are explained in my United States Patent 2,210,028, issued August 6, 1940, which covers special circuit arrangements for overcoming this limitation and obtaining efficiencies of 60 per cent or more.

Also high efficiency power amplifiers have heretofore been obtained by other circuit arrangements, for example, by using the general principle known as out-phasing modulation, or modulation by phase shift, as exemplified by United States Patents 2,269,518 and 2,282,706 of Chireix and Fagot issued January 13, 1942, and May 12, 1942, respectively, and United States Patent 2,282,714 of Fagot issued May 12, 1942.

In the last-named Fagot patent (2,282,714), two tubes, or two sets of tubes, operate as linear class B amplifiers for all values of the radio-frequency input wave from zero up to the carrier level. The load impedance into which these tubes work is made so high that good efficiency is obtained at this value of output, where the radio-frequency plate voltage swing is about as high as it can be. Then, for positive swings of modulation, to which the tubes cannot respond in a voltage sense, the load impedance is caused to decrease, until ultimately at the peak of a fully modulated wave, it becomes only one-fourth its original value, whereby the tubes, while unable to increase their plate voltage swing at all, can nevertheless deliver four times the carrier power, as required. The decrease in load impedance, beginning at the carrier amplitude, is achieved by an automatic variation in the relative phase of the radio-frequency grid potentials (and hence plate potentials) of the two tubes, or sets of tubes, on the upward swings of modulation. The output circuits are so designed that the two tubes or sets of tubes have an impedance-varying action on each other controlled entirely by the relative phases of the plate potentials.

The present invention relates to this general scheme of high-efficiency amplification by phase variation and provides an improved and simplified means for bringing about the necessary variation in the relative phases of the radio-frequency grid potentials. In the Chireix and Fagot patents cited, this is done either (*a*) by special means in the preceding amplifier stages, whereby the output of these stages is no longer a simple amplitude-modulated wave, or (*b*) by applying to the final stage grids, in quadrature with the normal modulated wave excitation, an additional voltage obtained by bucking two high voltages against each other, designated by Fagot in United States Patent 2,282,714 as $U_a$ and $U_b$—one derived from the final load circuit and one being an amplified replica of the grid input wave. Method (*b*) cannot in practice be applied without the use of an auxiliary amplifier tube such as tube 3 in Fig. 7 of said patent.

In accordance with the present invention, preceding amplifying stages deliver an amplitude modulated carrier wave to the input terminals of a final stage, and the necessary phase variations are then imposed upon this wave in an automatic manner by variations in the input impedances of the grids themselves. The variations in input impedances are a combination of (*a*) the rapid increase in the electronic shunt conductance of the grid, due to grid current, for values of excitation in excess of that required for the carrier output, and (*b*) a change in the apparent grid input susceptance resulting, as will be explained, from non-linearity in the voltage amplification of the tube at these higher values of excitation. The radio-frequency plate potential, as already indicated, is already at its maximum possible value at the carrier output. These effects (*a*) and (*b*) combine effectively to bring about the desired variations in the relative phases of the potentials appearing on the grids of the two tubes.

Referring to the figures of the drawing.

Before describing the invention in detail, it may be desirable to analyze the principle of high efficiency amplification by phase variation from simple circuit considerations. This is done primarily to clarify the operation and to establish precisely what the essential requirements for the grid excitation potentials should be to provide the proper phase relations in the actual circuits of Figs. 7, 8, etc.

Figure 7:
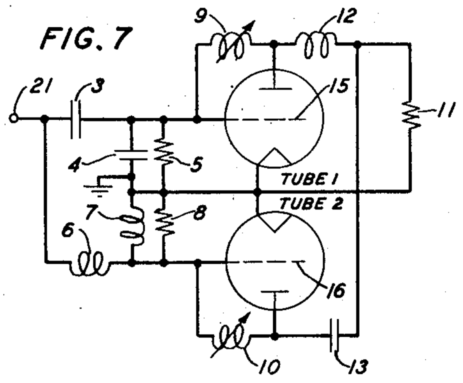
Fig. 7 is a simplified schematic of a power amplifier circuit in accordance with the invention.
Figure 8:
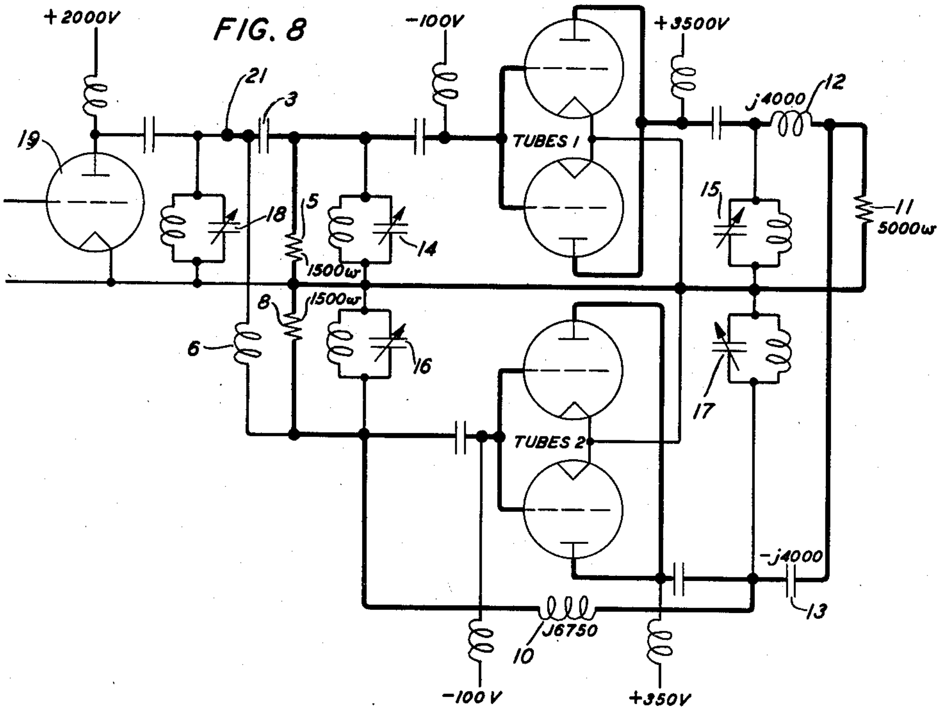
Fig. 8 is a detailed schematic of a modification thereof.

The tubes as shown in Figs. 7, 8 first of all, must work into a variable load impedance, which can be made to vary over a 4-to-1 range during the modulation cycle, remaining substantially resistive over this range.

Figure 1:
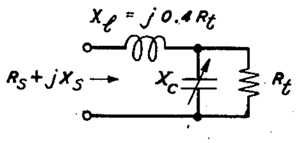
Fig. 1 is an exemplary circuit for a variable load impedance.

This is accomplished by making use, in effect, of a property of the circuit shown in Fig. 1. Here a coil reactance $X_l=j0.4R_t$ is in series with a variable capacitive reactance $X_c$ paralleled by the terminating resistance $R_t$. $X_c$ ranges from a value of $\frac{1}{2}R_t$ to $2R_t$ (a 4-to-1 ratio) to provide a 4-to-1 change in the sending end resistance $R_s$. The sending end reactance $+jX_s$ is quite low over the entire range.

Figure 2:
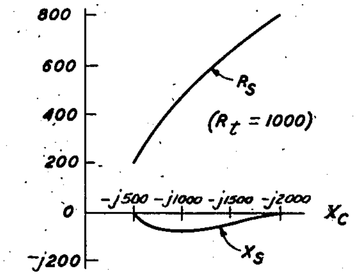
Figs. 2 and 3 are explanatory characteristic curves for the circuit of Fig. 1.

In Fig. 2, $R_s$ and $X_s$ are plotted against $X_c$ for a typical case where $R_t$ is 1,000 ohms. As $X_c$ is varied from 500 to 2,000 ohms, it is seen that the sending end reactance $X_s$ remains relatively small while the sending end resistance changes from 200 to 800 ohms.

From this numerical example it is seen that for a 4:1 change in input impedance, one should employ a terminating resistance which is five times the lowest value of input impedance desired.

Figure 3:
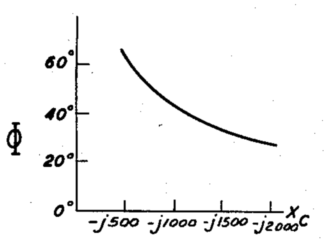

Fig. 3 shows the phase delay $\theta$ between the voltage applied to the circuit of Fig. 1 and the voltage appearing across the termination $R_t$. As is apparent, $\theta$ changes from $\tan^{-1}2$ or 63 degrees to $\tan^{-1}\frac{1}{2}$ or 27 degrees.

Now if by an inversion transformation of the Fig. 1 circuit, the coil $X_l$ were replaced by a condenser of equivalent impedance and if the condenser $X_c$ were replaced by a corresponding variable coil, the characteristics of the inverted circuit would be the same except that the small input reactance indicated by Fig. 2 would be positive instead of negative and the phase shift indicated by Fig. 3 would become a phase advance instead of a phase delay.

Figure 4:
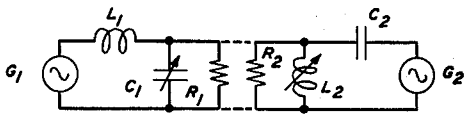
Figs. 4 and 5 are explanatory circuits synthesized from the prototype shown in Fig. 1.

Fig. 4 shows two prototype circuits $L_1$, $C_1$ and $L_2$, $C_2$ combined back to back, and excited by two generators $G_1$ and $G_2$. The circuits have the same constants, and their variable reactances $C_1$, $L_2$ are adjustable over a 4-to-1 range. $L_1$, $C_1$ has a positive phase shift, $L_2$, $C_2$ a negative phase shift.

The voltages across the two equal resistances $R_1$ and $R_2$ will have the same phase, provided the generators $G_1$ (leading) and $G_2$ (lagging) are made to differ in phase by an amount equal to twice the phase shift indicated by Fig. 3 (for each setting of the variable reactances).

If this is done, then not only could the two resistances be paralleled and made one without affecting the operation of the circuits, but the two variable reactances $C_1$, $L_2$ could be removed since they antiresonate each other.

Figure 5:
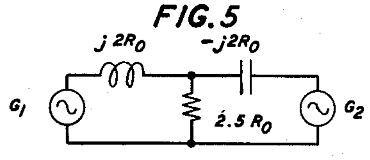

The resulting circuit would be as shown in Fig. 5. The load impedances seen by the two generators are controlled entirely by the relative phases of the two equal voltages generated. In effect, each source of power provides the equivalent of the original variable reactance needed by the other, and the effective value of that apparent reactance is determined by the phase difference between the two generators. It was seen in connection with Figs. 1 and 2 that with networks of the type being considered, the terminating resistance should be five times the lowest extreme value of input impedance desired. Consequently, when two terminating resistances are paralleled as in going from Fig. 4 to Fig. 5, the common resistance becomes 2.5 times the lowest value desired for the impedance to be seen by each generator. The values given in Fig. 5 are in terms of an impedance $R_0$ which is the lowest impedance into which each generator (i. e., each tube or group of tubes) should operate, that is, the impedance into which it must operate in delivering maximum power at the peak of modulation, namely, when the generator $G_1$ leads the load by 63 degrees and generator $G_2$ lags the load by 63 degrees. With the constants shown, each generator will operate into an impedance of $4R_0$ when $G_1$ leads by 27 degrees and $G_2$ lags by 27 degrees, and this is the condition which is to hold for all values of output from zero up to the carrier level in order that the carrier power (one-fourth the peak power) may be delivered at full radio-frequency plate voltage and hence maximum efficiency.

Figure 6:
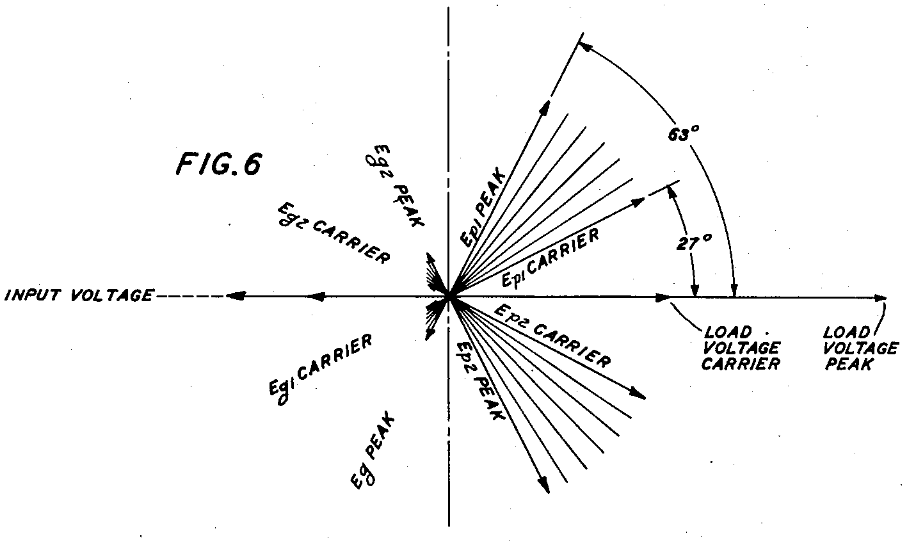
Fig. 6 is a polar diagram of the grid and plate potentials and their phase relations in accordance with the invention.

Fig. 6 shows the phase and amplitude relations of the plate potentials $E_{p1}$ and $E_{p2}$ of the two generators of Fig. 5 or the corresponding tubes of Fig. 7 for both carrier and peak conditions as well as intermediate conditions, the corresponding grid potentials $E_{g1}$ and $E_{g2}$ being likewise shown. While the plate potentials do not increase in magnitude between carrier and peak conditions, being already at a maximum, the grid potentials do increase. Measurements on power amplifier tubes show that approximately twice the grid excitation is required to obtain full peak power into the optimum load impedance $R_0$ as is required to obtain carrier power or one-fourth peak power into an impedance $4R_0$.

On the negative swings of modulation, the phase and amplitude relations remain exactly as shown for the "carrier" condition except that all quantities shrink down toward the origin in the same proportion, the amplifier being in effect a conventional linear class B amplifier for these smaller instantaneous outputs.

The grid potentials are shown as being opposite in phase to the respective plate potentials, as is always the case when a tube works into a substantially resistive load. It is, of course, the phases of the applied grid potentials that control the phases of the plate potentials and hence bring about the variable load impedance characteristic of this type of amplifier.

After these preliminary explanatory considerations, various circuits in accordance with the present invention will be described. Fig. 7 shows a two-tube amplifier, having as its input an amplitude-modulated wave applied between terminal 21 and ground. Load resistance 11, inductive reactance 12, and capactive reactance 13 correspond to the equivalent impedances of Fig. 5, and the two tubes of Fig. 7 correspond to the two generators of Fig. 5. The grid 15 of tube 1 is driven through a circuit consisting of condensers 3 and 4 and resistance 5, while the grid 16 of tube 2 is driven through a circuit consisting of coils 6 and 7 and resistance 8. Reactances 3 and 6 are equal and opposite at the carrier frequency. Reactances 4 and 7 are likewise equal and opposite at the carrier frequency. Grid resistors 5 and 8 are equal. The function of feedback coils 9 and 10 is partially to neutralize the plate-to-grid capacities of the tubes, in the manner disclosed in United States Patent 1,325,879 of H. W. Nichols, issued December 23, 1919, but these coils have here a further function which will be explained later. The plate of tube 1 is connected to a conventional load 11 by a coil 12. The plate of tube 2 is connected to the load by a condenser 13.

Direct-current potentials, chokes, and blocking condensers are omitted from Fig. 7 for simplicity.

The phases and amplitudes of the grid potentials of tubes 1 and 2 as compared with the phase and amplitude of the input potential applied at terminal 21, will depend not only on the impedance values of condensers 3, 4, coils 6, 7, resistances 5 and 8, but also on the input conductance and susceptance of the tubes 1, 2, respectively, which are in shunt with impedances 4, 5 and with 7, 8.

Consider first the conductance. When delivering one-fourth its peak power into a load impedance $4R_0$, the grid current of a power amplifier tube is very small and the grid input conductance may be considered negligible in comparison with that of a loading resistance such as 5 normally connected across it. When delivering its peak power, however, into the optimum load resistance $R_0$, the grid current is very substantial, having instantaneous values of the order of 20 per cent of the plate current. The rise in grid current commences when the plate voltage swing approaches its maximum (as it does at the carrier amplitude in this type of amplifier) since this brings the instantaneous plate potential down to a value not greatly exceeding the grid potential. As the excitation is increased beyond the carrier point, the rise in grid conductance is then very rapid and effects a substantial change in the termination of the grid network. In accordance with the invention, the grid shunting resistances 5 and 8 are chosen to be of the same order as the radio-frequency shunt input resistance of the grids 15, 16 at modulation peaks so that the effective values of resistances 5 and 8 are approximately halved when peak power is being delivered.

Consider next the grid input susceptance. The grid-filament capacity, which is fixed and can be lumped with the admittances of condenser 4 and coil 7 can be neglected, but the grid-plate capacitance of the tubes 1, 2 is of prime importance. In accordance with a well-known principle termed the "Miller effect," the grid-plate capacity $C_{pg}$ of a tube as viewed from the grid terminal is in effect multiplied by a factor $(1+E_p/E_g)$ when the radio-frequency plate and grid potentials $E_p$ and $E_g$ have their normal phase relation of 180 degrees. The term 1 in this expression can be ignored since it represents a fixed capacity that can be lumped with the grid-filament capacity. In the method of operation described in this invention, as in the Chireix and Fagot systems cited, $E_p$ does not change between carrier output and peak output, while $E_g$ doubles. An example of typical values of the ratio $E_p/E_g$ for some power tubes used in this circuit are $$\frac{E_p}{E_g}=18$$

for carrier output, and $$\frac{E_p}{E_g}=9$$

for peak output. Consequently, there is a large input capacity variation, amounting to $9C_{pg}$. It is to avoid such variations that amplifier tubes would ordinarily be neutralized. However, here the variation is used to advantage by adjusting feedback coil 9 to a value of inductance higher than necessary for complete neutralization of the plate-grid capacity $C_{pg}$, in order that there may be some residual unneutralized capacity. Between carrier output and peak output the multiplying factor for this residual capacity would decrease from a value of 18, for example, to 9. As a result, the effective input susceptance of the tube 1 is substantially decreased. This effect and the increased grid conductance, in conjunction with the input network consisting of condensers 3 and 4 and resistance 5, are both in a direction to advance the phase of the excitation on tube 1 as compared with the original phase. That is, referring again to Fig. 6, the vector designated "$E_{g1}$ carrier," in addition to increasing in length, experiences a phase advance and ultimately assumes a new phase angle as well as doubling in amplitude, as shown by the vector designated "$E_{g1}$ peak."

As for tube 2, its associated feedback coil 10 is given a value of inductance lower than the neutralizing value, rather than higher, so that the effective feedback admittance is inductive rather than capacitive. The admittance, as before, is multiplied in effect by the voltage amplification. The net result is to provide an inductive input susceptance in tube 2 which, like the capacitive input susceptance of tube 1, will decrease with increasing excitation. This effect and the increasing grid conductance, in conjunction with the input network consisting of coils 6 and 7 and resistance 8, are both in a direction to retard the phase of the excitation on tube 2 as compared with the original phase. That is, referring to Fig. 6, the vector designated "$E_{g2}$ carrier," in addition to increasing in length, experiences a phase retardation and ultimately, when doubled in length at the peak of the input modulated wave, is at a new phase angle as indicated by the designation "$E_{g2}$ peak."

Thus, by underneutralizing one tube and overneutralizing the other, input susceptance variations are obtained which, added to the conductance variations, effect the necessary changes in phase. In practice it is desirable to make use of both effects. To depend on the conductance effect alone would imply the use of relatively high fixed resistors 5 and 8 across the grids, which is not conducive to stability in power amplifiers. To depend on the susceptance effect alone would entail the use of very low resistors which would require unnecessarily high power from the previous driving stage (not shown).

Another point to be observed is that both of these effects, the conductance effect and the susceptance effect, come about through the plate voltage swings having reached its limiting value;

and therefore the effects are largely self-adjusting in that they do not occur until required.

In underneutralizing tube 1 by using a higher than normal neutralizing inductance 9, it will be found that at some frequency the required inductance is infinite; that is, the existing capacity $C_{pg}$ is just right to give the desired amount of feedback. Therefore, at frequencies below this, for instance at the lower-frequency end of the broadcast band, it is actually necessary to add to the existing plate-grid capacity instead of neutralizing some of it with the feedback coil 9.

In view of the foregoing it will now be more fully appreciated that the automatic phase-varying mechanism may consist of passive phase-shifting networks variably terminated by the power amplifier tubes, and that the prior-art need for auxiliary distorting amplifiers or other such active, power-requiring elements is thereby completely obviated.

Fig. 8 shows an actual design for a 1-kilowatt amplifier using the system previously described. In Fig. 8, the essential elements are shown in heavy lines, whereas other items such as choke coils and blocking condensers are shown in light lines. Circuit elements corresponding to those of Fig. 7 are given the same numerical legends. Tunable antiresonant circuits 14, 15, 16 and 17 are shown connected across the grid and plate circuits to tune out fixed static capacities. A similar antiresonant circuit 18 is shown across the output of the driving stage 19 which impresses an amplitude modulated wave at terminal 21 of the power amplifier. Tubes 1 and 2 each consist of two triodes similar to the Western Electric 357A in parallel. Each pair of tubes in parallel requires an 8,000-ohm load impedance for carrier output and 2,000 ohms for peak output. The values shown in Fig. 8 for circuit elements 11, 12, 13 provide these required impedances in accordance with Fig. 5, the above value of 2,000 ohms constituting the parameter $R_0$ of Fig. 5. The desired radio-frequency plate potential for high efficiency, with a direct-current supply of 3,500 volts, is 2,000 volts root mean square (2,800 volts peak) at both carrier and peak of modulation. The radio-frequency drive on each pair of grids is 120 volts root mean square at carrier and 240 volts root mean square at peak. The ratio $E_p/E_g$, which determines the multiplying factor for the grid-plate capacity, is accordingly 16.7 at carrier and 8.4 at peak.

The shunt radio-frequency grid resistance of each pair of tubes is 1,500 ohms at peak output, and the fixed resistances 5 and 8 paralleling the grids having a value of 1,500 ohms each. Thus, at the peak of modulation the terminating resistances of the grid networks are effectively halved by the grid conductance.

A frequency of 1,250 kilocycles is chosen for illustrative purposes. At this particular frequency, the total grid-plate capacity of two of these tubes in parallel is 815 micromicrofarad and the corresponding reactance 13,500 ohms. This is effectively reduced by the above $E_p/E_g$ ratio to 750 ohms at carrier and 1,500 ohms at peak. These values are suitable for use in the grid network of tubes 1 without modification; hence no inductance for partial neutralization of tubes 1 is shown. At lower frequencies the grid-plate capacity would have to be padded with additional capacitance as explained above. In the case of tubes 2, a neutralizing coil 10 of 6,750 ohms is shown, which in parallel with the plate-grid capacitive reactance which is twice this value, gives a resultant inductive reactance of 13,500 ohms, just equal to the feedback reactance being used in tubes 1 but opposite in effect because it is inductive.

Thus, the grid network driving tubes 1 consists in effect of a fixed series condenser 3 and a shunt combination which changes between carrier and peak from a 1,500-ohm resistance shunted by 750-ohm negative reactance to a 750-ohm resistance shunted by a 1,500-ohm negative reactance. The phase angle of this parallel combination therefore changes from $\tan^{-\frac{1}{2}}$ or 63 degrees to $\tan^{-1\frac{1}{2}}$ or 27 degrees. With a value for reactance 3 of approximately 3,000 ohms to give a suitable voltage step-down from the preceding stage (which operates with high voltage output but low power), the phase of the current flowing through condenser 3 and encountering the above parallel combination is approximately 90 degrees ahead of the voltage applied at 21. Accordingly, the voltage on the grid is ahead of that applied to terminal 21 by approximately 90 minus 63=27 degrees at carrier and 90 minus 27=63 degrees at peak, the amounts required by Fig. 6. Similarly, it can be shown that proper phase conditions obtain in the grid circuit of tubes 2.

In this embodiment (Fig. 8), we have not required circuit elements 4 and 7 of Fig. 7. In cases where the voltage transformation desired from the preceding stage is not such as to entail use of a high value for reactances 3 and 6, so that the current flowing from 3 and 6 toward the grids may not be 90 degrees out of phase with the voltage applied at 21, finite values for elements 4 and 7 would be required. In practice 4 and 7 would be provided simply by a change in the tuning of resonant circuits 14 and 16.

Figure 9:
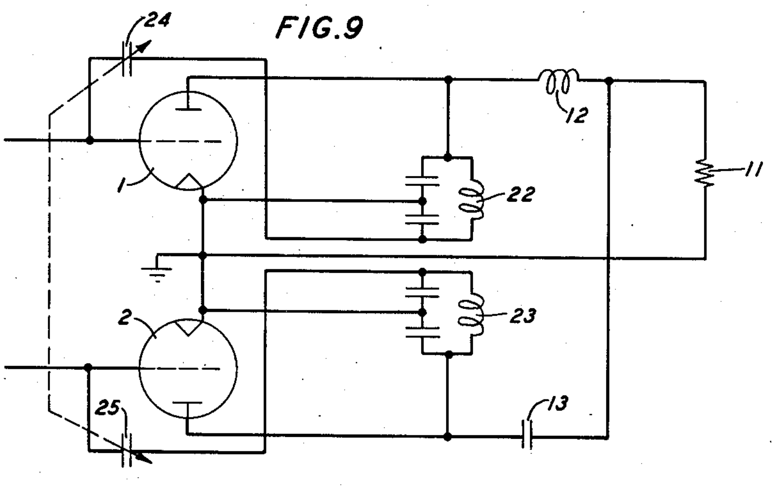
Fig. 9 is another modification of the circuit shown in Fig. 7.

Another method of achieving the required deneutralization of the tubes is shown in Fig. 9. Here the two tubes 1, 2 are each provided with conventional type built-out neutralizing circuits 22 and 23, and neutralizing condensers 24 and 25 are connected between the grids and points in the built-out circuits where the potentials are approximately equal and opposite in phase to the plate potentials. In this modification, it is convenient to obtain adjustment by first neutralizing the tubes in a conventional manner and then ganging the condensers together in a reverse manner as shown so that one will decrease as much as the other increases when the deneutralization is carried out.

Figure 10:
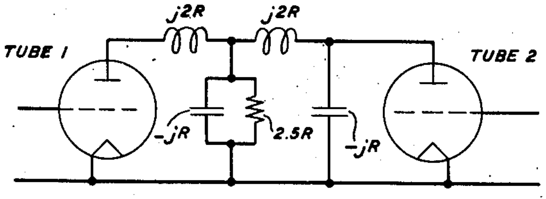
Fig. 10 is a variant of the derived circuit of Fig. 5.

Other methods of over- and under-neutralization of grid-plate capacities will become apparent to those skilled in the art. Also, other methods may be used for connecting the tubes to the load in amplifiers employing the phase variation method of amplification. For instance, it can be shown by circuit transformations well understood in the art that the circuit of Fig. 10, using the reactance and resistance values given, is an alternative to that of Fig. 5, except that in Fig. 10 there is in effect an additional 90-degree phase shift between each tube and the load, and because of the well-known impedance-inverting action of 90-degree phase shift networks, the impedances seen by the tubes would be $R_0$ when they should be $4R_0$ and vice versa. Consequently, when employing the embodiment given in Fig. 10 the grid potentials must be 2 times 63 degrees apart in phase for amplitudes up to the carrier amplitude, and must shift to 2 times 27 degrees at maximum amplitude, instead of vice versa. To those versed in the art, it will be apparent how the grid circuit and deneutralizing means can be arranged to accomplish this in accordance with the principles I have described.

What is claimed is:

1. In a system for high-efficiency amplification of amplitude-modulated carrier waves of the type in which a pair of amplifiers, each comprising a tube having a grid, cathode and anode, have respective grid-cathode circuits to which said amplitude-modulated waves are applied in like form but with a relative displacement of phase, and respective anode-cathode circuits from which said waves are delivered with a complementary displacement of phase to a common load, in which each of said amplifier has a substantially linear voltage amplification characteristic from zero to normal input carrier levels but exhibits anode voltage saturation from normal to peak input carrier levels and in which said relative displacement of phase is varied with input carrier level from normal to peak levels: an improved arrangement for effecting the aforementioned variation in relative phase displacement consisting of an individual passive phase shifting network, in each said grid-cathode circuit, whose phase shift is a function of its terminating impedance and each of which networks is terminated by the grid-cathode impedance of a respective one of said tubes, and circuit means to change the effective grid-cathode impedance of each said tube progressively under the control of and in response to progressive change in input carrier level beginning at substantially said normal level and progressing to said peak level.

2. The subject matter of claim 1 in which said circuit means to change the effective grid-cathode impedance comprises circuit means whereby each of said grids draws grid current beginning at normal input carrier level and substantially increasing as the input carrier level increases from normal to peak level, whereby the grid-cathode conductance of each said tube is correspondingly increased.

3. The subject matter of claim 1 in which said means to change the effective grid-cathode impedance comprises a respective feed back connection from anode to grid of each said tube, one of said feed back connections being effectively inductive and the other effectively capacitive at said carrier frequency, whereby the effective grid-cathode susceptance is varied.

4. A wave amplifying system of high efficiency comprising a source of amplitude modulated carrier waves varying in amplitude from zero level through a normal input carrier level to a predetermined peak input carrier level, a pair of power amplifier tubes each having a grid, a cathode and an anode, an individual wave input circuit connected to the grid and cathode of each said tube, a passive circuit coupled connecting said individual input circuits directly in parallel to said source, said coupler comprising a phase advancing network individual to one of said input circuits and a complementary phase retarding network individual to the other, each of said networks including the grid-cathode impedance of the individually corresponding tube as a phase-affecting terminating element thereof, a load, an individual wave output circuit connecting the anode and cathode of each said tube in phase-aiding relation to said load, circuit means whereby each said tube has a substantially linear voltage characteristic from zero to normal input carrier levels but exhibits anode voltage saturation from normal to peak input carrier levels, circuit means whereby each of said grids draws substantial grid current beginning at normal input carrier level and substantially, rapidly, continuously increasing as the input carrier level increases from normal to peak level, and a respective feedback path from anode to grid of each said tube, one effectively inductive and the other effectively capacitive at said carrier frequency, whereby the resistive and reactive components of the grid-cathode impedance of both tubes are varied concurrently to vary the phase shifts introduced by said networks as said input carrier level varies between normal and peak levels.

5. The subject matter of claim 4 in which the grid-cathode impedance of each said tube is shunted by resistance substantially equal in magnitude to the resistive component of the effective grid-cathode impedance of the tube at peak input carrier level.

WILLIAM H. DOHERTY.

References Cited in the file of this patent

UNITED STATES PATENTS

| Number | Name | Date |
|---|---|---|
| 2,238,236 | Terman | Apr. 15, 1941 |
| 2,248,132 | Smith | July 8, 1941 |
| 2,269,518 | Chireix et al. | Jan. 13, 1942 |
| 2,282,706 | Chireix et al. | May 12, 1942 |
| 2,282,714 | Fagot | May 12, 1942 |
| 2,435,547 | Nikis | Feb. 3, 1948 |

OTHER REFERENCES

Article—"A New Method of Amplifying With High Efficiency a Carrier Wave Modulated in Amplitude by a Voice Wave," by Sidney T. Fisher, from proceedings of the IRE for January 1946 pages 3p–13p., vol. 4, No. 11.